United States Patent
Fujita et al.

(10) Patent No.: US 6,660,445 B2
(45) Date of Patent: Dec. 9, 2003

(54) PHOTOSENSITIVE COMPOSITION COMPRISING A VINYL COPOLYMER AND AN O-NAPHTHOQUINONE DIAZIDE COMPOUND

(75) Inventors: Kazuo Fujita, Shizuoka-Ken (JP); Shiro Tan, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/970,988

(22) Filed: Oct. 5, 2001

(65) Prior Publication Data

US 2002/0068235 A1 Jun. 6, 2002

(30) Foreign Application Priority Data

Oct. 13, 2000 (JP) .......................................... 2000-312929
Mar. 12, 2001 (JP) .......................................... 2001-69062

(51) Int. Cl.$^7$ ............................................... G03F 7/023
(52) U.S. Cl. ...................... 430/192; 430/165; 430/166; 430/191; 430/193; 430/302
(58) Field of Search ................................ 430/192, 193, 430/191, 165, 166, 302

(56) References Cited

U.S. PATENT DOCUMENTS

| 5,141,838 A | * | 8/1992 | Aoshima et al. ............. 430/191 |
| 5,326,674 A | * | 7/1994 | Toyama et al. .............. 430/325 |
| 5,731,127 A | * | 3/1998 | Ishizuka et al. ......... 430/270.1 |
| 6,110,640 A | * | 8/2000 | Kawamura et al. ...... 430/270.1 |
| 6,340,551 B1 | * | 1/2002 | Miyake et al. .............. 430/192 |

FOREIGN PATENT DOCUMENTS

| DE | 37 42 387 A1 | 6/1988 | |
| EP | 0 544 264 A1 | 6/1993 | |
| EP | 0 684 521 A1 | 11/1995 | |
| EP | 0 737 896 A2 | 10/1996 | |
| EP | 0 766 140 A1 | 4/1997 | |
| EP | 0 843 218 A1 | 5/1998 | |
| EP | 0 949 539 A2 | 10/1999 | |
| JP | 63089864 A | * | 4/1988 | ............. G03F/7/02 |
| JP | 63226641 A | * | 9/1988 | ............. G03C/1/72 |

* cited by examiner

Primary Examiner—John S. Chu
(74) Attorney, Agent, or Firm—Burns, Doane, Swecker & Mathis, LLP

(57) ABSTRACT

The present invention relates to a photosensitive compound comprising a vinyl polymer compound which is insoluble in water and soluble in an aqueous alkaline solution and o-naphthoquinonediazide compound, wherein said vinyl polymer compound is a copolymer comprising at least one monomer unit derived from monomer compound (A): a compound having an alkaline-soluble group represented by general formula (I), (II) or (III) as defined in the specification, and at least one monomer unit derived from monomer compound (B): (meth)acrylate having poly (oxyalkylene) chain. A lithographic printing plate prepared from a presensitized plate having a photosensitive layer of said photosensitive compound of the present invention shows improvement of abrasion resistance, printing durability, chemical resistance, development latitude, and contamination property.

5 Claims, No Drawings

PHOTOSENSITIVE COMPOSITION COMPRISING A VINYL COPOLYMER AND AN O-NAPHTHOQUINONE DIAZIDE COMPOUND

BACKGROUND OF THE INVENTION

The present invention relates to a photosensitive composition which is utilized for preparation of a lithographic printing plate, an integrated circuit or a photomask. More specifically, the present invention relates to a presensitized plate useful for preparation of a lithographic printing plate that has wide development latitude, excellent coupling property, ball-point adaptability, sensitivity and stability as well as small change of sensitivity after long time, comprising photosensitive composition comprising a polymer compound being excellent in abrasion resistance and chemical resistance.

A photosensitive composition comprising o-naphthoquinonediazide compound and a novolak-type phenol resin has been industrially utilized for the preparation of lithographic printing plate or photoresist as a useful photosensitive composition.

However, the novolak-type phenol resin which is a main component of the photosensitive composition has many defects, e.g., poor adhesion to the substrate, brittleness of the film made of the resin, poor application property, poor abrasion resistance, and insufficient durability during printing process, when the composition is used for lithographic printing plate. Moreover, it shows poor chemical resistance and particularly when it is used with UV ink, the durability becomes insufficient.

In order to improve these properties, a presensitized plate is generally subjected to burning treatment (that is, to heat a plate after light exposure and development). However, such burning treatment causes another problem. That is, it causes contamination on prints obtained from such treated plate because low molecular compounds are sublimated from photosensitive layer of an image area during the burning treatment to adhere to a non-image area of the plate.

To solve the problem, a number of polymers are studied as a binder for the photosensitive composition. For example, it has been proposed to use polyhydroxystyrene or hydroxystyrene copolymer in Japanese Patent Publication for Opposition Purpose hereunder referred to as "J. P. KOKOKU") No. Sho 52-41050. Some properties of the film made of the copolymer are certainly improved, but still it shows poor abrasion resistance and chemical resistance. Also, it has been proposed to use a polymer comprising a structural unit derived from acrylic acid in Japanese Patent Unexamined Publication (hereunder referred to as "J. P. KOKAI") No. Sho 51-34711. But a lithographic printing plate using the polymer shows narrow latitude for developing condition and it also shows insufficient abrasion resistance. In addition, it has been proposed to use the following compounds as a binder; a polymer comprising a sulfonamide group in J. P. KOKAI No. Hei 2-866, polymers comprising a group derived from acrylic acid with phenolic hydroxy group in J. P. KOKAI Nos. Sho 63-89864, Hei 1-35436, Hei 1-52139, and Hei 8-339082. However, abrasion resistance of the lithographic printing plates using these polymers are still insufficient and also it causes contamination during printing process.

Japanese patent application, J. P. KOKAI No. Sho 63-226641 discloses a positive-working photosensitive composition comprising as a binder an alkaline-soluble polymer having active imino group, which shows improved film-forming property, adhesiveness to substrate and abrasion resistance.

But, usually a developer consists of alkaline water and is used repeatedly. Thus, alkaline content in a developer, after it was used to develop many plates for a long time, may be decreased to result in deterioration of developability of the developer compared with a fresh developer (that is, it may take a longer time to develop a plate by a used developer than that by a fresh one). Also, precipitates are often observed in such a used developer. Thus, still it is necessary to provide a photosensitive composition which provides a lithographic printing plate that can be developed in a short time even with a used developer. Also, it is necessary to provide a photosensitive composition which can be suitably used under a wide development condition.

SUMMARY OF THE INVENTION

An object of the present invention is to provide a photosensitive composition useful for preparing a presensitized plate for a lithographic printing plate which can be developed with an aqueous alkaline developer and shows good abrasion resistance and printing durability.

Another object of the present invention is to provide a photosensitive composition useful for preparing a presensitized plate for a lithographic printing plate which shows good chemical resistance and shows good printing durability when it is printed using UV ink without burning treatment.

Still another object of the present invention is to provide a photosensitive composition useful for preparing a presensitized plate for a lithographic printing plate which shows wide latitude under development condition and no contamination during printing process.

Yet another object of the present invention is to provide a photosensitive composition useful for preparing a presensitized plate for a lithographic printing plate which can be quickly developed and shows wide latitude in development even when it is developed with a used developer.

It is a further object of the present invention to provide a photosensitive composition which shows good adhesiveness to the substrate and good solubility to an organic solvent and provides flexible film.

The inventors of the present invention studied various composition of vinyl copolymers and found that the above-described problems can be solved by a positive-working photosensitive composition comprising a vinyl polymer compound which is insoluble in water and soluble in an aqueous alkaline solution and o-naphthoquinonediazide compound, wherein said vinyl polymer compound is a copolymer comprising at least one monomer unit derived from (A) a monomer compound having an alkaline-soluble group and at least one monomer unit derived from (B) (meth)acrylate having poly(oxyalkylene) chain, to thus accomplish the present invention.

Namely, the present invention is a photosensitive composition comprising a vinyl polymer compound which is insoluble in water and soluble in an aqueous alkaline solution, wherein said vinyl polymer compound is a copolymer comprising at least one monomer unit derived from the following monomer compound (A) and at least one monomer unit derived from the following monomer compound (B).

(A) a compound having an alkaline-soluble group, represented by the following general formulation (I), (II) or (III):

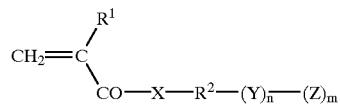
(I)

(wherein, X represents —O— or —NR$^3$—; R$^1$ represents —H or —CH$_3$; R$^2$ represents single bond or bivalent organic group; Y represents arylene group; Z represents —OH, —COOH, —SO$_2$NHR$^4$, —NHSO$_2$R$^5$, —CONHSO$_2$R$^6$, —SO$_2$NHCOR$^7$, —NHCONHSO$_2$R$^8$, —SO$_2$NHCONHR$^9$, —CONHSO$_2$NHR$^{10}$, —NHSO$_2$NHCOR$^{11}$, —SO$_2$NHSO$_2$R$^{12}$, —COCH$_2$COR$^{13}$, —OCONH SO$_2$R$^{14}$, or SO$_2$NHCOOR$^{15}$; n represents 0 or 1, but when R$^2$ is single bond and Z is —OH, n is 1; m is an integer of 1 or higher; R$^3$ represents hydrogen atom or optionally substituted C1–12 alkyl group, cycloalkyl group, aryl group or aralkyl group; R$^4$, R$^9$, R$^{10}$ represents hydrogen atom or optionally substituted C1–12 alkyl group, cycloalkyl group, aryl group or aralkyl group; R$^5$, R$^6$, R$^7$, R$^8$, R$^{11}$, R$^{12}$, R$^{13}$, R$^{14}$, and R$^{15}$ each represents optionally substituted C1–12 alkyl group, cycloalkyl group, aryl group or aralkyl group).

(II)

[wherein A represents hydrogen atom, halogen atom or alkyl group; B represents single bond, alkylene group, phenylene group, substituted alkylene group or substituted phenylene group;

X$^1$ represents

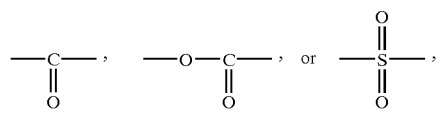

X$^2$ represents

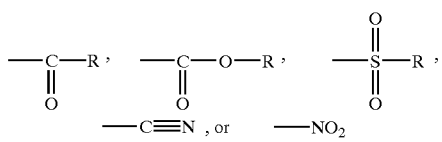

(wherein, R represents optionally substituted alkyl group, cycloalkyl group, phenyl group, or naphthyl group).]

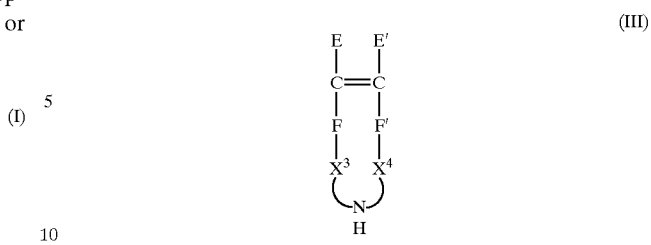
(III)

(wherein, E and E' each represents hydrogen atom, halogen atom, alkyl group or phenyl group; F and F' each separately represents single bond, alkylene group or substituted alkylene group;

X$^3$ and X$^4$ each represents

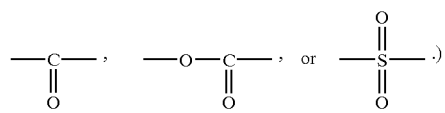

(B)(meth)acrylate having poly(oxyalkylene) chain.

DESCRIPTION OF THE PREFERRED EMBODIMENTS

The details of the present invention will be described below.

Vinyl polymer compound which is insoluble in water and soluble in an aqueous alkaline solution utilized in the present invention is a polymer which may be prepared by polymerizing at least one (A) compound having an alkaline-soluble group, and at least one (B) (meth)acrylate having poly(oxyalkylene) chain, in the presence of known polymerization initiator in a suitable solvent.

According to the present invention, a compound having an alkaline-soluble group (A) includes compounds represented by the following general formula (I), (II) or (III).

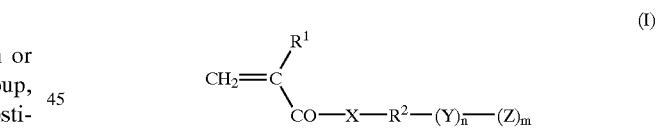
(I)

(wherein, X represents —O— or —NR$^3$—; R$^1$ represents —H or —CH$_3$; R$^2$ represents single bond or bivalent organic group; Y represents arylene group; Z represents —OH, —COOH, —SO$_2$NHR$^4$, —NHSO$_2$R$^5$, —CONHSO$_2$R$^6$, —SO$_2$NHCOR$^7$, —NHCONHSO$_2$R$^8$, —SO$_2$NHCONHR$^9$, —CONHSO$_2$NHR$^{10}$, —NHSO$_2$NHCOR$^{11}$, —SO$_2$NHSO$_2$R$^{12}$, —COCH$_2$COR$^{13}$, —OCONHSO$_2$R$^{14}$, or SO$_2$NHCOOR$^{15}$; n represents 0 or 1, but when R$^2$ is single bond and Z is —OH, n represents 1; m represents an integer of 1 or higher; R$^3$ represents hydrogen atom or optionally substituted C1–12 alkyl group, cycloalkyl group, aryl group or aralkyl group; R$^4$, R$^9$, R$^{10}$ represents hydrogen atom or optionally substituted C1–12 alkyl group, cycloalkyl group, aryl group or aralkyl group; R$^5$, R$^6$, R$^7$, R$^8$, R$^{11}$, R$^{12}$, R$^{13}$, R$^{14}$, R$^{15}$ represents optionally substituted C1–12 alkyl group, cycloalkyl group, aryl group or aralkyl group.)

In formula (I), preferably, Y is phenylene group or naphthylene group, Z is —OH, —COOH, —SO$_2$NHR$^4$, or —NH$_2$SO$_2$R$^5$, n is 1, m is 1 or 2, X is —O— or —NR$^3$— (wherein R$^3$ is hydrogen atom), R$^4$ is hydrogen atom, C1–3 alkyl group or optionally substituted phenylene group, R$^5$ is C1–3 alkyl group or optionally substituted phenylene group. R$^2$ is any bivalent organic group which links X or Y, or Z in the case that n is 0. Examples of the bivalent organic group include optionally substituted alkylene group, cycloalkylene group, arylene group as well as group comprising ester linking group, amide linking group, imide linking group, ether linking group, urethane linking group and/or urea linking group, although the bivalent organic group is not limited thereto. More preferably, R$^2$ may be a single bond or optionally substituted C1–12 alkylene group, C1–12 cycloalkylene group, C1–12 arylene group, ester linking group, amide linking group, imide linking group, ether linking group, urethane linking group and/or urea linking group. Particularly preferred R2 in the present invention is a single bond, C1–12 alkylene group, and C1–12 alkylene group having a linking group.

In the above definitions in formula (I), a substituent of each group may be preferably selected from the group consisting of halogen atom, C1–4 alkylene group and C1–4 alkylene alkoxy group.

Examples of low molecular compounds represented by general formula (I) include those described in J. P. KOKAI No. Sho 63-89864, J. P. KOKAI No. Sho 63-226641, J. P. KOKAI No. Hei 2-866, J. P. KOKAI No. Hei 8-339082, and J. P. KOKAI No. Hei 12-250216. Preferable compounds are the following compounds.

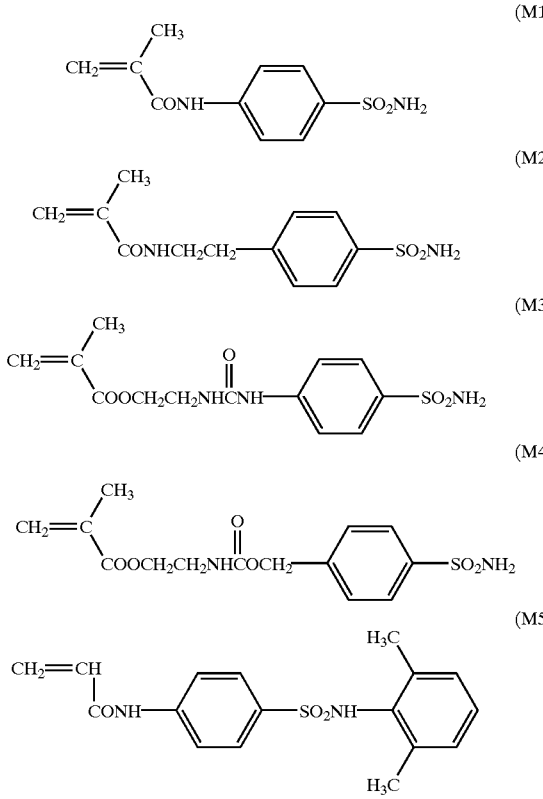

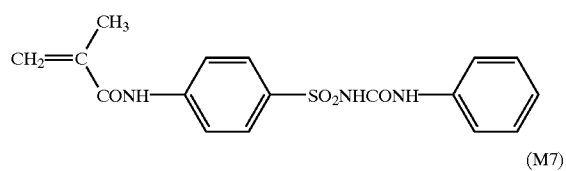

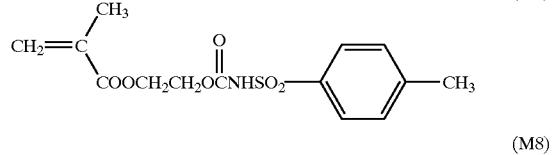

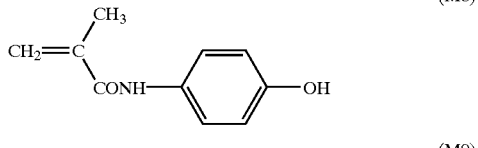

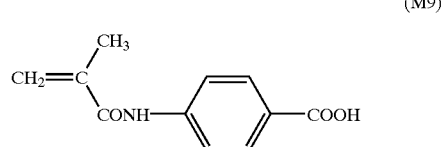

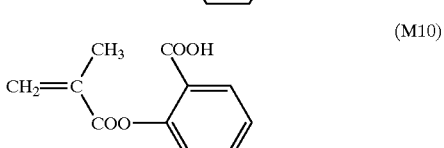

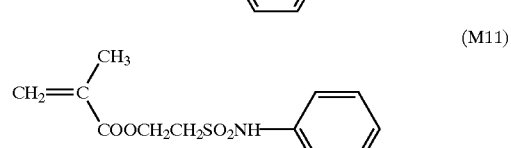

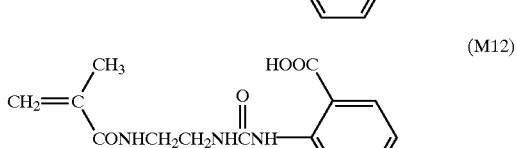

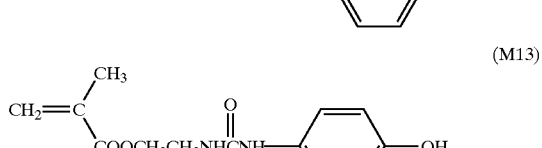

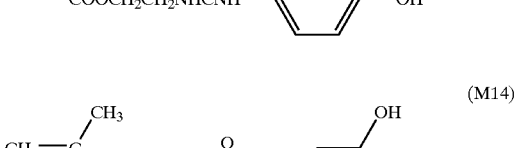

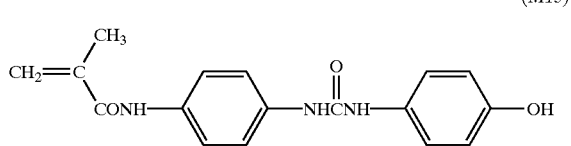

-continued (M16)

$$CH_2=C(CH_3)-CONH-C_6H_4-SO_2NHCONH-C_6H_5$$

(M17)

$$CH_2=CH-COOCH_2CH_2SO_2NHCOCH_3$$

(M18)

$$CH_2=CH-CONH-C_6H_4-CONHSO_2NH_2$$

(M19)

$$CH_2=C(CH_3)-CONH-C_6H_4-SO_2NHCO-C_6H_5$$

(M20)

$$CH_2=CH-CONH-C_6H_4-SO_2NH_2$$

General formula (II) is as follows;

$$H_2C=C\genfrac{}{}{0pt}{}{A}{B-X^1-NH-X^2}$$ (II)

[wherein A represents hydrogen atom, halogen atom or alkyl group; B represents single bond, alkylene group, phenylene group, substituted alkylene group or substituted phenylene group;

$X^1$ represents $$-\underset{O}{\overset{O}{C}}-, \quad -O-\underset{O}{\overset{O}{C}}-, \quad \text{or} \quad -\underset{O}{\overset{O}{\underset{\|}{S}}}-;$$

$X^2$ represents $$-\underset{O}{\overset{O}{C}}-R, \quad -\underset{O}{\overset{O}{C}}-O-R, \quad -\underset{O}{\overset{O}{\underset{\|}{S}}}-R,$$

$$-C\equiv N, \quad \text{or} \quad -NO_2$$

(wherein, R represents optionally substituted alkyl group, cycloalkyl group, phenyl group, or naphthyl group).]

General formula (III) is as follows;

$$\begin{array}{c} E \quad E' \\ | \quad | \\ C=C \\ | \quad | \\ F \quad F' \\ | \quad | \\ X^3 \quad X^4 \\ \diagdown N \diagup \\ | \\ H \end{array}$$ (III)

(wherein, E and E' each represents hydrogen atom, halogen atom, alkyl group or phenyl group; F and F' each separately represents single bond, alkylene group or substituted alkylene group;

$X^3$ and $X^4$ each represents $$-\underset{O}{\overset{O}{C}}-, \quad -O-\underset{O}{\overset{O}{C}}-, \quad \text{or} \quad -\underset{O}{\overset{O}{\underset{\|}{S}}}-.)$$

In general formula (II), A represents hydrogen atom, halogen atom or alkyl group, but preferably hydrogen atom or C1–4 alkyl group, and more preferably hydrogen atom or methyl group. B represents single bond, alkylene group, phenylene group, substituted alkylene group or substituted phenylene group, preferably a single bond, C1–4 alkylene group, and phenylene group, and more preferably single bond or phenylene group.

$X^1$ represents $$-\underset{O}{\overset{O}{C}}-, \quad -O-\underset{O}{\overset{O}{C}}-, \quad \text{or} \quad -\underset{O}{\overset{O}{\underset{\|}{S}}}-,$$

and more preferably, $$-\underset{O}{\overset{O}{C}}-, \quad -\underset{O}{\overset{O}{\underset{\|}{S}}}-.$$

$X^2$ represents $$-\underset{O}{\overset{O}{C}}-R, \quad -\underset{O}{\overset{O}{C}}-O-R, \quad -\underset{O}{\overset{O}{\underset{\|}{S}}}-R,$$

$$-C\equiv N, \quad -NO_2$$

and more preferably, $$-\underset{O}{\overset{O}{C}}-R, \quad -\underset{O}{\overset{O}{\underset{\|}{S}}}-R.$$

wherein, R represents optionally substituted alkyl group, cycloalkyl group, phenyl group, or naphthyl group, and preferably phenyl group, naphthyl group, cyclohexyl group or C1–4 alkyl group, which may have halogen atom, C1–4 alkyl group or alkoxy group as a substituent.

In the above definitions in formula (II), substituent of each group may be preferably selected from the group consisting of halogen atom, C1–4 alkylene group and C1–4 alkylene alkoxy group.

In general formula (III), E and E' each represents hydrogen atom, halogen atom, alkyl group or phenyl group, preferably, hydrogen atom or C1–4 alkyl group, and more preferably hydrogen atom.

F and F' each separately represents single bond, alkylene group or substituted alkylene group, preferably single bond or C1–4 alkylene group, and more preferably single bond or methylene group.

$X^3$ and $X^4$ represent

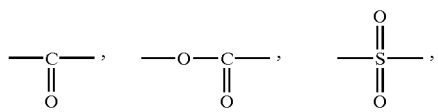

and preferably,

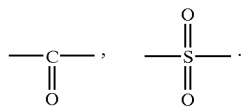

In the above definitions in formula (III), substituent of each group may be preferably selected from the group consisting of halogen atom, C1–4 alkylene group and C1–4 alkylene alkoxy group.

Examples of the low molecular compounds represented by general formula (II) or (III) include the following compounds.

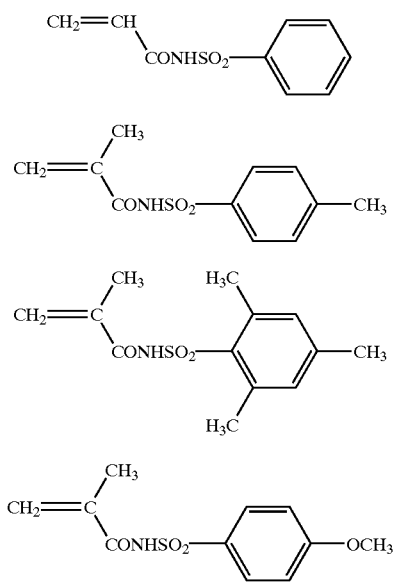

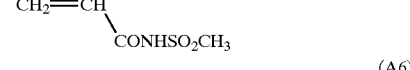

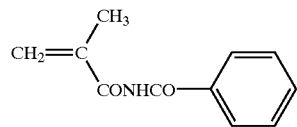

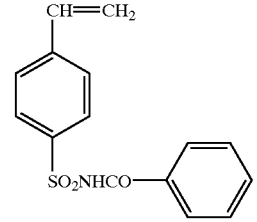

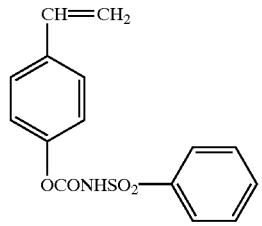

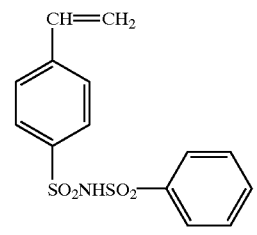

The content of monomer unit derived from (A) a compound having an alkaline-soluble group may range from 1 to 60 mole % and preferably from 10 to 35 mole %. In the case that the content is less than 1 mole %, it causes poor developability and contamination and the content of over 60 mole % is not appropriate because it causes so-called Genzo Nagare (that means an image area to be remained is developed) or deterioration of durability.

Hereinafter, (meth)acrylate having poly(oxyalkylene) chain (B) will be described. The above described poly(oxyalkylene) chain may be represented by general formula —(OR)x—, wherein, R represents alkylene group preferably having 2 to 4 carbon atoms, e.g., —CH$_2$CH$_2$—, —CH$_2$CH$_2$CH$_2$—, —CH(CH$_3$)CH$_2$—, —CH(CH$_3$)CH(CH$_3$)— and the like; and x means the number of oxyalkylene unit and is generally from 2 to 50 and preferably from 2 to 30.

Said poly(oxyalkylene) chain may consist of the same oxyalkylene unit such as poly(oxyethylene) chain or poly(oxypropylene) chain, or may consist of at least two kinds of oxyalkylene units that are connected in a random manner. The poly(oxyalkylene) chain also may consist of straight oxyalkylene unit (for example, oxyethylene unit), branched oxyalkylene unit (for example, oxypropylene unit), or block-copolymer thereof.

The poly(oxyalkylene) chain may be directly bonded to (meth)acrylic acid portion through ester bond or one or more of other linking group. Examples of such linking group include alkylene group, arylene group, or combination of said group and ester linking group, amide linking group, ether linking group, urethane linking group, and/or sulfonamide linking group. If the linking group is tri- or more multi-valent group, tri- or more poly(oxyalkylene) chains can be connected. In such case, (meth)acrylate having plural poly(oxyalkylene) chains that are connected through linking group can be obtained.

Examples of (meth)acrylate having poly(oxyalkylene) chain include methoxydiethylene glycol methacrylate (Kyoeisha Yushi, MC, Sin Nakamura Kagaku, M-20G, NOF Corp., PME-100), butoxy triethylene glycol acrylate (Kyoeisha Yushi), 2-(2-ethoxyethoxy)ethyl acrylate (Kyoeisha Yushi, ECA, Osaka Organic Chemical Industry Ltd., Biscoat 190, Sartmer SR-256), methoxy triethylene glycol acrylate (Kyoeisha Yushi, MTG-4), methoxy triethylene glycol methacrylate (Kyoeisha Yushi, Light ester MTG), methoxy tetraethylene glycol methacrylate (Sin Nakamura Kagaku, NK ester M-40G, NOF Corp., Blenmer PME-200), methoxy polyethylene glycol 400 methacrylate (Sin Nakamura Kagaku, NK ester M-90G, NOF Corp., Blenmer PME-400), methoxy polyethylene glycol 1000 methacrylate (Kyoeisha Yushi, DPM-A), methoxy dipropylene glycol acrylate (Kyoeisha Yushi, DPM-A), phenoxydiethylene glycol acrylate (Toa Gosei Co. Ltd., Allonix M-101, Sin Nakamura Kagaku, NK ester AMP-20G, Nippon Kayaku Co. Ltd., Kayarad R-564), phenoxytetraethylene glycol acrylate (Toa Gosei Co. Ltd., Allonix M-102), phenoxyhexaethylene glycol acrylate (Sin Nakamura Kagaku, NK ester AMP-60G), polyethylene glycol 90 methacrylate (NOF Corp., Blenmer PE-90), polyethylene glycol 200 methacrylate (NOF Corp., Blenmer PE-200), polyethylene glycol 400 methacrylate (NOF Corp., Blenmer PE-350), polypropylene glycol 300 methacrylate (NOF Corp., Blenmer PP-330), polypropylene glycol methacrylate (Sartmer SR-604), polypropylene glycol 500 methacrylate (NOF Corp., Blenmer PP-500), polypropylene glycol 800 methacrylate (NOF Corp., Blenmer PP-800), polyethylene glycol/polypropylene glycol methacrylate (NOF Corp., Blenmer PEP series), polyethylene glycol/polybutylene glycol methacrylate (NOF Corp., Blenmer PET series).

The content of (B) (meth)acrylate having poly(oxyalkylene) chain, which is suitably used as a vinyl polymer compound which is insoluble water and soluble in an aqueous alkaline solution, may be from 1 to 50 mole %. In the case that the content is less than 1 mole %, it causes poor developability and contamination and the content of over 50 mole % is not appropriate because it causes so-called Genzo Nagare (development of image area).

The vinyl polymer compound usable in the present invention may be a copolymer consisting of at least one monomer unit from (A) a compound having an alkaline-soluble group and at least one monomer unit from (B) (meth)acrylate having poly(oxyalkylene) chain, but preferably a copolymer comprising said monomer units and at least one monomer unit derived from a monomer compound having at least one polymerizable unsaturated bond but no alkaline soluble group represented by general formula (I), (II) or (III) and no poly(oxyalkylene) chain. In other words, the vinyl polymer compound of the present invention is preferably a copolymer comprising, in addition to monomer units (A) and (B), at least one monomer unit derived from (C) a monomer compound having at least one polymerizable unsaturated bond but no alkaline soluble group represented by general formula (I), (II) or (III) and no poly(oxyalkylene) chain.

Examples of such compound having at least one polymerizable unsaturated bond but no alkaline soluble group represented by general formula (I), (II) or (III) and no poly(oxyalkylene) chain include compounds having polymerizable unsaturated bond that are selected from the group consisting of acrylic acid, methacrylic acid, acrylic acid esters, acrylamides, methacrylic acid esters, methacrylamides, aryl compounds, vinyl ethers, vinyl esters, styrenes, and crotonic acid esters. More specifically, it includes acrylic acid esters such as alkyl acrylate (preferably said alkyl group may have 1 to 10 carbon atoms) (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate and the like), aryl acrylate(e.g., phenyl acrylate and the like):

methacrylic acid esters such as alkyl methacrylate (preferably said alkyl group may have 1 to 10 carbon atoms) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate and the like), aryl methacrylate (e.g., phenyl methacrylate, cresyl methacrylate, naphthyl methacrylate and the like):

acrylamides such as acrylamide, N-alkylacrylamide (wherein said alkyl group may have 1 to 10 carbon atoms, e.g., methyl group, ethyl group, propyl group, butyl group, t-butyl group, heptyl group, octyl group, cyclohexyl group, hydroxyethyl group, benzyl group and the like), N-arylacrylamide (wherein said aryl group includes, for example, phenyl group, tolyl group, nitrophenyl group, naphthyl group, hydroxyphenyl group and the like), N,N-dialkylacrylamide (examples of said alkyl group include those having 1 to 10 carbon atoms, e.g., methyl group, ethyl group, butyl group, isobutyl group, ethylhexyl group, cyclohexyl group), N,N-arylacrylamide (example of said aryl group includes phenyl group), N-methyl-N-phenylacrylamide, N-hydroxyethyl-N-methylacrylamide, N-2-acetamidoethyl-N-acetylacrylamide and the like:

methacrylamides such as methacrylamide, N-alkylmethacrylamide (examples of said alkyl group include those having 1 to 10 carbon atoms, e.g., methyl group, ethyl group, t-butyl group, ethylhexyl group, hydroxyethyl group, cyclohexyl group and the like), N-arylmethacrylamide (examples of said aryl group include phenyl group and the like), N,N-dialkylmethacrylamide (examples of said alkyl group include ethyl group, propyl group, butyl group and the like), N,N-diarylmethacrylamide (examples of said aryl group include phenyl group and the like), N-hydroxyethyl-N-methylmethacrylamide, N-methyl-N-phenylmethacrylamide, N-ethyl-N-phenylmethacrylamide and the like:

aryl compounds such as aryl esters (e.g., aryl acetate, aryl caproate, aryl caprylate, aryl laurate, aryl palmitate, aryl stearate, aryl benzoate, aryl acetoacetate, aryl lactate and the like), and aryloxyethanol: vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, dimethylaminoethyl vinyl ether, diethylaminoethyl vinyl ether, butylaminoethyl vinyl ether, benzyl vinyl ether, tetrahydrofurfuryl vinyl ether and the like), vinyl aryl ether (e.g., vinyl phenyl ether, vinyl tolyl ether, vinyl chlorophenyl ether, vinyl-2,4-dichlorophenyl ether, vinyl naphthyl ether, vinyl anthranyl ether and the like):

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-$\beta$-phenylbutyrate, vinyl cyclohexylcarboxylate, vinyl benzoate, vinyl salicylate, vinyl chlorobenzoate, vinyl tetrachlorobenzoate, and vinyl naphthoate: styrenes such as styrene and alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene and the like), alkoxystyrene (e.g., methoxystyrene, 4-methoxy-3-methylstyrene, dimethoxystyrene and the like), halogenized styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene and the like):

crotonic acid esters such as alkyl crotonate (e.g., butyl crotonate, hexyl crotonate, glycerin monocrotonate and the like): dialkyl itaconates (e.g., dimethyl itaconate, diethyl itaconate, dibutyl itaconate and the like): dialkyl esters of maleic acid or fumaric acid (e.g., dimethyl maleate, dibutyl fumarate and the like): acrylonitrile, methacrylonitrile and the like.

Preferred compounds having polymerizable unsaturated bond are methacrylic acid esters, acrylic acid esters, methacrylamides, acrylamides, acrylonitrile, methacrylonitrile, methacrylic acid, and acrylic acid and particularly preferred compounds are acrylonitrile and methacrylonitrile.

One or more of these compounds can be used in the present invention. Preferred amount of these copolymer components may range from 0 to 80 mole % and particularly preferred amount may range from 30 to 80 mole %.

The copolymer of at least one of the compounds having polymerizable unsaturated bond, at least one of low molecular compounds represented by general formula (I), (II) or (III) and (meth)acrylate having poly(oxyalkylene) chain may be block copolymer, random copolymer or graft copolymer.

Examples of solvent used for preparation of these polymer compounds include ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate and the like. The solvent can be used alone or in combination.

The molecular weight of the vinyl polymer compound of the present invention is preferably 2,000 or above by weight-average molecular weight and 1,000 or above by number-average molecular weight. More preferably, the weight-average molecular weight ranges from 5,000 to 300,000 and the number-average molecular weight ranges 2,000 to 250,000. In addition, polydispersity (weight-average molecular weight/number-average molecular weight) of the vinyl polymer compound of the present invention is preferably 1 or above and more preferably from 1.1 to 10.

Further, the vinyl polymer compound of the present invention may comprise unreacted monomer compounds. In this case, the content of monomer in the vinyl polymer compound is desirably 15% by weight or below.

The vinyl polymer compound of the present invention may be used alone or in combination. The photosensitive composition of the present invention comprises the vinyl polymer compound in an amount of about 3 to 95% by weight and preferably from about 5 to 85% by weight.

Preferred o-naphthoquinonediazide compounds are esters of 1,2-diazonaphthoquinonesulfonic acid with pyrogallol-acetone resin as disclosed in J. P. KOKOKU No. Sho 43-28403 (U.S. Pat. No. 3,635,709). Other preferred o-quinonediazide compounds are, for instance, esters of 1,2-diazonaphthoquinone-5-sulfonic acid with phenol-formaldehyde resin as disclosed in U.S. Pat. Nos. 3,046,120 and 3,188,210.

Examples of other preferred o-naphthoquinonediazide compounds include those known and disclosed in a variety of patents such as J. P. KOKAI Nos. Sho 47-5303, Sho 48-63802, Sho 48-63803, Sho 48-96575, Sho 49-38701 and Sho 48-13354, J. P. KOKOKU Nos. Sho 37-18015, Sho 41-11222, Sho 45-9610 and Sho 49-17481, U.S. Pat. Nos. 2,797,213; 3,454,400; 3,544,323; 3,573,917; 3,674,495 and 3,785,825; U.K. Patent Nos. 1,227,602; 1,251,345; 1,267,005; 1,329,888 and 1,330,932; and German Pat. No. 854,890.

Particularly preferred o-naphthoquinonediazide compounds are those obtained through the reaction of polyhydroxy compounds having molecular weight of not more than 1,000 with 1,2-diazonaphthoquinonesulfonic acid. Specific examples thereof are those disclosed in, for instance, J. P. KOKAI Nos. Sho 51-139402, Sho 58-150948, Sho 58-203434, Sho 59-165053, Sho 60-121445, Sho 60-134235, Sho 60-163043, Sho 61-118744, Sho 62-10645, Sho 62-10646, Sho 62-153950, Sho 62-178562 and Sho 64-76047; and U.S. Pat. Nos. 3,102,809; 3,126,281; 3,130,047; 3,148,983; 3,184,310; 3,188,2 10 and 4,639,406.

These o-naphthoquinonediazide compounds are preferably obtained by reacting polyhydroxy compounds with 1,2-diazonaphthoquinonesulfonic acid chloride in an amount ranging from 0.2 to 1.2 eq, more preferably 0.3 to 1.0 eq.

In this respect, the resulting o-naphthoquinonediazide compound is a mixture of products variously differing in the positions of 1,2-diazonaphthoquinonesulfonate groups and the amounts thereof introduced, but preferred are those having a rate of the compound whose hydroxyl groups are all converted into 1,2-diazonaphthoquinonesulfonic acid esters (content of the completely esterified compound) of not less than 5 mole %, more preferably 20 to 99 mole %.

The photosensitive composition used in the invention preferably comprises o-naphthoquinonediazide compound in an amount suitably ranging from 10 to 50% by weight and more preferably 15 to 40% by weight.

The photosensitive composition of the present invention may further comprise, in addition to said polymer compounds, a known alkaline water-soluble compounds such as phenol-formaldehyde resins and cresol-formaldehyde resins, for instance, m- and p-cresol-formaldehyde resins, m-/p-mixed cresol-formaldehyde resins and phenol-cresol (m-/p-/o- or m-/p- or m-/o-)-mixed formaldehyde resins, phenol-modified xylene resins, polyhydroxystyrenes, halogenated polyhydroxystyrenes and the like. Preferred weight-average molecular weight of these copolymers ranges from 500 to 20,000 and number-average molecular weight ranges from 200 to 60,000.

The amount of these alkaline-soluble compounds is not more than 70% by weight on the basis of the total weight of the photosensitive composition.

Moreover, the photosensitive composition used in the invention preferably comprises, for the improvement of the ink receptivity of images, phenol/formaldehyde condensates carrying alkyl groups having 3 to 8 carbon atoms as substituents as disclosed in U.S. Pat. No. 4,123,279 (e.g., t-butylphenol/formaldehyde resin and octylphenol/formaldehyde resin).

The photosensitive composition used in the invention preferably comprises, for the improvement of sensitivity, cyclic acid anhydrides, phenols and/or organic acids. Examples of such cyclic acid anhydrides are, as disclosed in U.S. Pat. No. 4,115,128, phthalic anhydride, tetrahydrophthalic anhydride, hexahydrophthalic anhydride, 3,6-endoxy-?4-tetrahydrophthalic anhydride, tetrachlorophthalic anhydride, maleic anhydride, chloromaleic anhydride, a-phenylmaleic anhydride, succinic anhydride and pyromellitic anhydride.

Examples of phenols include bisphenol A, p-nitrophenol, p-ethoxyphenol, 2,3,4-trihydroxybenzophenone, 4-hydroxybenzophenone, 2,4,4'-trihydroxybenzophenone, 4,4,4'-trihydroxytriphenylmethane, and 4,4',3",4"-tetrahydroxy-3,5,3',5'-tetramethyltriphenylmethane.

Such organic acids are, for instance, sulfonic acids, sulfinic acids, alkylsulfuric acids, phosphonic acids, phosphinic acids, phosphoric acid esters and carboxylic acids as disclosed in J. P. KOKAI Nos. Sho 60-88942 and Hei 2-96755 and specific examples thereof are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid and ascorbic acid.

The content of the foregoing cyclic acid anhydrides, phenols and/or organic acids in the photosensitive composition preferably ranges from 0.05 to 15% by weight and more preferably 0.1 to 5% by weight.

The composition used in the invention may further comprise, for extending the development latitude, non-ionic surfactants as disclosed in J. P. KOKAI Nos. Sho 62-251740 and Hei 4-68355 and/or amphoteric surfactants as disclosed in J. P. KOKAI No. Sho 59-121044 and Hei 4-13149.

Specific examples of non-ionic surfactants are polyoxyethylene/polyoxypropylene block polymer sorbitan tristearate, sorbitan monopalmitate, sorbitan trioleate, stearyl monoglyceride, polyoxyethylene sorbitan monooleate and polyoxyethylene nonylphenyl ether and examples of amphoteric surfactants are alkyl di(aminoethyl) glycine, alkyl polyaminoethyl glycine hydrochloride, Amorgen K (trade name of an N-tetradecyl-N,N-betaine type surfactant, available from Dai-Ichi Kogyo Seiyaku Co., Ltd.), 2-alkyl-N-carboxyethyl-N-hydroxyethyl imidazolinium betaine and Rebon 15 (trade name of an alkyl imidazoline type one available from Sanyo Chemical Industries, Ltd.). Among them, polyoxyethylene/polyoxypropylene block polymer is the most preferable surfactant.

The content of the foregoing non-ionic and/or amphoteric surfactants in the composition ranges from 0.05 to 15% by weight and more preferably 0.1 to 5% by weight.

The photosensitive composition used in the invention may comprise a printing out agent for obtaining a visible image immediately after exposure to light, a dye or pigment for coloring images and other fillers. A representative example of the printing out agent is a combination of a photosensitive compound capable of releasing an acid through exposure to light with a salt-forming organic dye, for instance, a combination of o-naphthoquinonediazido-4-sulfonic acid halide with a salt-forming organic dye as disclosed in J. P. KOKAI Nos. Sho 50-36209 (=U.S. Pat. No. 3,969,118) and Sho 53-8128; and a combination of a trihalomethyl compound with a salt-forming organic dye as disclosed in J. P. KOKAI Nos. Sho 53-36223 (=U.S. Pat. 4,160,671), Sho 54-74728 (=U.S. Pat. 4,232,106), Sho 60-3626, Sho 60-138539, Sho 61-143748, Sho 61-151644 and Sho 63-58440 (=U.S. Pat. 5,064,741).

Such trihalomethyl compounds include oxadiazole and triazine type compounds and both are excellent in stability with time and can provide clear printed out images. If a presensitized plate using an aluminum substrate having 1.0 $g/m^2$ or more of anodized film is utilized, it may result in deterioration of property relating to "remaining of color". Thus, the present invention is effective in such case; that is, no "remaining of color" is observed even when such compound are utilized.

Other dyes may also be used instead of or together with the foregoing salt-forming organic dyes as an agent for coloring images. Preferred dyes inclusive of the salt-forming organic dyes are, for instance, oil-soluble and basic dyes. Specific examples thereof are Oil Yellow #101 and #130, Oil Pink #312, Oil Green BG, Oil Blue BOS and #603, Oil Black BY, BS and T-505 (they are all available from Orient Chemical Industries, Co., Ltd.), Victoria Pure Blue, Crystal Violet (CI 42555), Methyl Violet (CI 42535), Ethyl Violet (CI 42600), Rhodamine B (CI 145170B), Malachite Green (CI 42000) and Methylene Blue (CI 52015). Particularly preferred are those disclosed in J. P. KOKAI No. Sho 62-293247 (=GB 2192729).

The photosensitive composition of the present invention may be dissolved and dispersed in a solvent capable of dissolving the foregoing components and then applied onto a substrate. Examples of solvents used herein include γ-butyrolactone, ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone, tetrahydrofurfurylalcohol, acetone, diacetonealcohol, methanol, ethanol, isopropanol, diethylene glycol dimethyl ether and the like and these solvent may be used alone or in combination. The photosensitive composition is dissolved and dispersed in such a solvent in a concentration ranging from 2 to 50% by weight (solid content). The coated amount of the photosensitive composition layer photosensitive layer) applied onto the substrate varies depending on the applications of the resulting plate, but preferably ranges from 0.5 to 3.0 $g/m^2$ (weighed after drying). As the coated amount decreases, the quantity of light necessary for exposure can be reduced, but the strength of the coating layer may be lowered.

The photosensitive composition may comprise a surfactant such as a fluorine atom-containing surfactant as disclosed in J. P. KOKAI No. Sho 62-170950 (=U.S. Pat.

4,822,713) for improving the coating properties thereof. The amount thereof to be added preferably ranges from 0.01 to 1.0% by weight, more preferably 0.05 to 0.5% by weight on the basis of the total weight of the composition.

When a lithographic printing plate is prepared using the photosensitive composition of the present invention, a substrate for the printing plate may be preferably an aluminum plate. Preferred aluminum plates are, for instance, those of pure aluminum or an aluminum alloy consisting of aluminum and a other elements such as silicon, manganese, copper, magnesium, chromium, zinc, lead, bismuth, nickel and the like. The composition may comprise negligible quantity of impurities in addition to a small amount of iron and titanium.

The surface of aluminum plate may be optionally subjected to other treatment. For example, the surface of the plate is preferably subjected to a treatment such as graining, dipping into an aqueous solution of sodium silicate, potassium fluorozirconate or a phosphoric acid salt and anodizing. Further preferable aluminum plates include, for instance, those which are grained and then immersed in an aqueous solution of sodium silicate as disclosed in U.S. Pat. No. 2,714,066; and those anodized and then dipped in an aqueous solution of an alkali metal silicate as disclosed in U.S. Pat. No.3,181,461. The above-described anodization can be conducted by passing a current through the aluminum plate as a cathode in an electrolyte, which is a single or combined aqueous or non-aqueous solution comprising inorganic acid (e.g., phosphoric acid, chromic acid, sulfamic acid, sulfuric acid, boric acid and the like), organic acid (e.g., oxalic acid, sulfamic acid and the like) or salts thereof.

It is also effective to subject the aluminum substrate to silicate electrodeposition as disclosed in U.S. Pat. No. 3,658,662. These hydrophilization treatments are performed not only for making the surface of the substrate hydrophilic but also for preventing the occurrence of any detrimental reaction with the photosensitive composition applied thereon and for enhancing the adhesion thereof to the photosensitive layer.

The aluminum plate may be optionally subjected to removal of rolling oil and/or to pretreatment to expose a clean surface before graining the surface. For said removal of rolling oil, solvent such as triclene and/or surfactants can be used. For said pretreatment, generally an alkaline etchant such as sodium hydroxide, potassium hydroxide and the like can be used.

The aluminum plate can be surface-grained by, for instance, mechanical, chemical or electrochemical surface graining treatment. The mechanical surface-graining treatment can be carried out by any known methods such as ball graining, blast graining, and brush graining with nylon brush using slurry of pumice stones as an abrasive in water. Suitable chemical surface graining is, for example, to dip the plate into a saturated aqueous solution of aluminum salt of mineral acid as described in J. P. KOKAI No. Sho 54-31187. Preferred electrochemical surface graining is, for instance, to conduct electrolysis by passing an alternating current through the aluminum plate in an acidic electrolyte such as hydrochloric acid, nitric acid and mixture thereof. Among these graining methods, it is preferable to use a combination of mechanical graining and electrochemical graining since adhesion of image to such treated substrate is strong.

It is preferred to conduct the above-mentioned graining so that the roughness of the surface at centerline of aluminum plate (Ha) becomes in a range of 0.3 to 1.0 $\mu$.

Thus grained aluminum plate may be optionally subjected to washing with water and chemical etching. A solution for the etching treatment is generally selected from basic or acidic aqueous solutions which are capable of dissolving aluminum. The solution should be selected from the solutions that do not form a layer derived from components of the solution on the surface subjected to etching. Examples of preferred etching agents (etchants) include basic materials such as sodium hydroxide, potassium hydroxide, tribasic sodium phosphate, dibasic sodium phosphate, tribasic potassium phosphate, dibasic potassium phosphate and the like; and acidic materials such as sulfuric acid, persulfuric acid, phosphoric acid, hydrochloric acid and salt thereof. Metals having lower ionization tendency than that of aluminum such as zinc, chromium, cobalt, nickel, and copper are not preferable because undesired layer will be formed on the surface.

It is preferable to conduct the etching under conditions (such as concentration, temperature and the like) such that the rate of dissolution of aluminum or alloy thereof ranges 0.3 to 40 g/m$^2$ per one minute of dipping. But it is also possible to use other condition that exceeds or underperfoms this range. The etching may be conducted by immersing the aluminum plate in the aforementioned etching solution or by applying the etching solution on the aluminum plate. Preferably, the etching is conducted so that the amount of etching becomes in the range of 0.5 to 10 g/m$^2$.

As the above-described etching agent, it is preferable to use basic solutions since etching rate is fast. In this case, generally the plate is subjected to desmutting treatment since smut is formed on the surface of the plate. Examples of acid used for desmutting treatment include nitric acid, sulfuric acid, phosphoric acid, chromic acid, hydrofluoric acid, fluoroboric acid and the like.

The aluminum plate subjected to etching treatment may be optionally washed with water and anodized. Anodization can be conducted by any method conventionally utilized in this field. More specifically, anodized layer can be formed on the surface of aluminum substrate by passing direct or alternating current through the aluminum plate in an aqueous solution comprising one or more of sulfuric acid, phosphoric acid, chromic acid, oxalic acid, sulfamic acid, and benzenesulfonic acid or non-aqueous solution.

Although the condition for anodization varies depending on the electrolyte used, generally the following conditions are suitably used; concentration of electrolyte is from 1% to 80% by weight, temperature of the solution is from 5 to 70° C., current density is from 0.5 to 60 A/dm$^2$, electrical voltage is 1 to 100 V, time for anodization is 30 seconds to 50 minutes. Among the anodization methods, particularly the method to anodize in sulfuric acid using high current density described in British Patent No. 1,412,768, and the method to anodize using phosphoric acid as an electrolyte described in U.S. Pat. No. 3,511,661 are preferred.

Thus grained and anodized aluminum plate may be further optionally hydrophilized. Examples of preferred hydrophilization treatment are; to treat the aluminum plate in a solution of alkali metal silicate such as sodium silicate solution as described in U.S. Pat. Nos. 2,714,066 and 3,181,461, to treat the plate with potassium fluorozirconate as described in J. P. KOKOKU No. Sho 36-22063, and to treat the plate with polyvinylphosphonic acid as described in U.S. Pat. No. 4,153,461.

Further, an underlying layer comprising water-soluble compound may be also applied, if desired, onto the aluminum plate that has been grained, anodized and optionally hydrophilized. Water-soluble compounds used in the underlying layer are, for instance, combination of water-soluble metal salt and hydrophilic cellulose (e.g., zinc chloride and carboxymethylcellulose, magnesium chloride and hydroxyethylcellulose and the like) as described in J. P. KOKOKU No. Sho 57-16349, polyacrylamide as described in U.S. Pat. No. 3,511,661, polyvinylphosphonic acid as described in J. P. KOKOKU No. Sho 46-35685, amino acid and salts thereof (alkali metal salts such as Na salt, K salt and the like, ammonium salt, hydrochloride, oxalate, acetate, phosphate and the like) as described in J. P. KOKAI No. Sho 60-149491, amines comprising hydroxy group and salts thereof as described in J. P. KOKAI No. Sho 60-232998 and amines comprising hydroxy group and salts thereof is particularly preferred. Preferably, the solid content of the underlying layer comprising water-soluble compound is 1 mg/m$^2$ to 80mg/m$^2$.

A mat layer is preferably formed on the surface of the photosensitive layer thus formed to reduce the time required for evacuation during contact exposure using a vacuum printing frame and to prevent the formation of an indistinct image during printing. Such mat layer can be formed by the method as disclosed in J. P. KOKAI No. Sho 50-125805, J. P. KOKOKU Nos. Sho 57-6582 and Sho 61-28986, or by the method of heat-welding of solid powder onto the surface of the photosensitive layer as disclosed in J. P. KOKOKU No. Sho 62-62337.

Preferable developer for the presensitized plate of the present invention is an alkali aqueous solution that does not substantially comprise organic solvent. Examples of such alkali aqueous solution include aqueous solution of sodium silicate, potassium silicate, sodium hydroxide, potassium hydroxide, lithium hydroxide, tribasic sodium phosphate, dibasic sodium phosphate, tribasic ammonium phosphate, dibasic ammonium phosphate, sodium metasilicate, sodium carbonate, sodium bicarbonate, potassium carbonate, potassium bicarbonate, ammonia water and the like. These alkaline agents may be added so that the concentration thereof is in the range of 0.1% to 10% by weight, preferably in the range of 0.5% to 5% by weight.

Among these developers, preferred are those comprising alkali silicates such as potassium silicate, lithium silicate, sodium silicate and the like since contamination in printing can be reduced by such developers. Preferably a developer comprising sodium silicate having a molar ratio; [SiO$_2$]/[M] ranging from 0.5 to 2.5 and SiO$_2$ content ranging from 0.8% to 8% by weight. The developer may comprise, for example, water-soluble sulfites such as sodium sulfite, potassium sulfite and magnesium sulfite, resorcin, methylresorcin, hydroquinone, thiosalicylic acid and the like. The amount of these compounds in the developer ranges preferably from 0.002% to 4% by weight and more preferably from 0.01% to 1% by weight.

Preferable developer usable in the present invention is an aqueous alkaline solution having pH of 12.5 or less and more preferably from 8 to 11. Examples of basic compounds to adjust pH of the solution to such range include phosphate salt such as tribasic sodium phosphate, tribasic potassium phosphate, tribasic ammonium phosphate, dibasic sodium phosphate, dibasic potassium phosphate, and dibasic ammonium phosphate, carbonate salt such as ammonium bicarbonate, sodium carbonate, potassium carbonate, ammonium carbonate, sodium bicarbonate, and potassium bicarbonate, alkali metal hydroxide compound such as sodium hydroxide, potassium hydroxide, and lithium hydroxide, ammonia water and the like. Particularly preferred is combination of carbonate salt and bicarbonate salt. The above described salts can be used alone or in combination.

Examples of another basic compounds for the developer of the present invention include aqueous organic amine compounds such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine, pyridine and the like. Among them, monoethanolamine, diethanolamine, and triethanolamine are particularly preferred. These compounds may be used in combination with inorganic alkaline metal salts. The content of these basic compounds in an aqueous solution may be selected so that pH of the solution becomes 12.5 or less and more preferably 8 to 11. Generally, the content of the basic compounds can be selected from the range of 0.05 to 10% by weight.

Also, the developer usable in the present invention may further comprise at least one of anionic surfactant or amphoteric surfactant as described in J. P. KOKAI Nos. Sho 50-51324 and Sho 59-84241, or nonionic surfactant as described in J. P. KOKAI Nos. Sho 59-75255, Sho 60-111246 and Sho 60-213943. Alternatively, the developer may comprise polymer electrolyte as described in J. P. KOKAI Nos. Sho 55-95946 and Sho 50-142528. These additives are preferable since they can improve wetting property of the developer to the photosensitive composition or improve the stability (latitude) during development. The amount of such surfactant added to the developer is preferably from 0.001% to 2% by weight, and more preferably from 0.003% to 0.5% by weight.

In addition, the content of potassium as an alkali metal of said alkali silicate is preferably 20 mole % or more based on the total alkali metals because of less formation of insoluble materials. More preferably, the amount of potassium is 90 mole % or more and most preferably 100 mole %.

In addition, the developer usable in the present invention may further comprise anti-foaming agent such as organic solvent (e.g., some alcohols), chelating agent as described in J. P. KOKAI No. Sho 58-190952, metallic salt as described in J. P. KOKOKU No. Hei 1-30139, organic silane compounds and the like.

Examples of light source suitable for exposure in the present invention include carbon arc light, mercury vapor lamp, xenon lamp, tungsten lamp, metal halide lamp, and the like.

The presensitized plate prepared from the photosensitive composition of the present invention can be processed as described in J. P. KOKAI Nos. Sho 54-8002, Sho 55-115045 and Sho 59-58431. That is, the plate may be subjected to washing-treatment with water and desensitizing treatment after development, or directly subjected to desensitizing treatment, treatment with acid-containing water, or desensitizing treatment after the treatment with acid-containing water. In the development process of the presensitized plate, developability of the developer sometimes becomes lowered because of decrease of the alkaline concentration as a result of consumption of aqueous alkaline solution used for the development or contamination of air after running automatic developing machine for long time. In such case, the developability of the developer can be recovered by adding replenisher or by replenishing method as described in J. P. KOKAI No. Sho 54-62004. In such case, it is preferable to replenish using method described in U.S. Pat. No. 4,882,246. In addition, it is preferable to conduct the above process using an automatic developing machine as described in J. P. KOKAI Nos. Hei 2-7054 and Hei 2-32357.

Further, after image-wise exposing, developing, washing with water and rinsing the presensitized plate prepared from the photosensitive composition of the present invention, if it is necessary to remove undesired image, a solution for elimination as described in J. P. KOKOKU No. Hei 2-13293 can be preferably used. In addition, example of desensitizing gum optionally used in the last step in the preparation of the lithographic plate includes those as described in J. P. KOKOKU Nos. Sho 62-16834 Sho 62-25118, and Sho 63-52600, and J. P. KOKAI Nos. Sho 62-7595, Sho 62-11693, and Sho 62-83194.

In addition, when the burning treatment is conducted after the optional process to remove the image area as described above, it is preferable to treat the plate with a leveling solution for a surface as described in J. P. KOKOKU Nos. Sho 61-2518 and Sho 55-28062, and J. P. KOKAI Nos. Sho 62-31859 and Sho 61-159655 prior to the burning treatment.

EXAMPLES

The present invention will hereunder be explained in more detail with reference to the following non-limitative working Examples and Preparation Examples.

Preparation Example 1

Into a 200 ml volume of three-neck round bottom flask equipped with a condenser, an agitator and a dropping funnel, N-(p-aminosulfonylphenyl)methacrylamide (4.81 g, 0.020 mole), tetraethylene glycol monomethyl ether methacrylate (1.38 g, 0.005 mole), methyl methacrylate (1.50 g, 0.015 mole), acrylonitrile (3.18 g, 0.06 mole) and N,N-dimethylacetamide (20 g) were added and the mixture was heated to 65° C. in a water bath at 65° C. under stirring. To the mixture, V-65 (Wako Pure Chemicals Co. Ltd.) (0.25 g) was added and the mixture was stirred for 2 hours at 65° C. under nitrogen atmosphere. A mixture of N-(p-aminosulfonylphenyl)methacrylamide (4.81 g), tetraethylene glycol monomethyl ether methacrylate (1.38 g), methyl methacrylate (1.50 g), acrylonitrile (3.18 g), N,N-dimethylacetamide (20 g) and V-65 (0.25 g) was added dropwise to the reaction mixture over 2 hours through a dripping funnel. After completion of the addition of the mixture, the reaction mixture was further stirred for 2 hours at 65° C. After then, 40 g of methanol was added and the mixture was cooled. The cooled mixture was poured into two litter of water under stirring. The stirring was continued for another 30 minutes and then, it was filtered and dried to obtain 18 g of white solid. Weight-average molecular weight of the polymer determined by gel permeation chromatography (polystyrene standard) was 48,000 (vinyl polymer compound (a) of the present invention).

Preparation examples 2 to 9

Polymers (b) to (q) (shown in Table 1) were prepared as described in Preparation example 1.

TABLE 1

| vinyl polymer compound | structure units of polymer | molar ratio of units | molecular weight |
|---|---|---|---|
| (a) | −(CH₂−C(CH₃)(CONH−C₆H₄−SO₂NH₂))− / −(CH₂−C(CH₃)(COO(C₂H₄O)₂CH₃))− / −(CH₂−CH(CN))− / −(CH₂−C(CH₃)(COOCH₃))− | 20:5:60:15 | 4800 |
| (b) | −(CH₂−C(CH₃)(CONH−C₆H₄−SO₂NH₂))− / −(CH₂−C(CH₃)(COO(C₂H₄O)₂CH₃))− / −(CH₂−CH(CN))− / −(CH₂−C(CH₃)(COOCH₂−C₆H₅))− | 25:20:45:10 | 36000 |
| (c) | −(CH₂−C(CH₃)(COOCH₂CH₂NHCOCH₂−C₆H₄−OH))− / −(CH₂−CH(COO(C₃H₆O)₄CH₃))− / −(CH₂−C(CH₃)(COOCH₃))− | 15:10:60:15 | 58000 |
| (d) | −(CH₂−C(CH₃)(COOCH₂CH₂NHCNH−C₆H₄−OH))− / −(CH₂−C(CH₃)(CO₂(C₂H₄O)₂C₂H₄))− | 20:50:30 | 48000 |
| (e) | −(CH₂−C(CH₃)(CONH−C₆H₄−SO₂NH₂))− / −(CH₂−CH(CO₂(C₂H₄O)₁₁(C₃H₆O)₂₂(C₂H₄O)₁₁H))− / −(CH₂−C(CH₃)(COOCH₃))− | 30:5:65 | 26000 |
| (f) | −(CH₂−C(CH₃)(CONH−C₆H₄−OH))− / −(CH₂−CH(COO(C₂H₄O)₄CH₃))− / −(CH₂−C(CH₃)(COOCH₃))− | 25:30:45 | 67000 |

TABLE 1-continued

| vinyl polymer compound | structure units of polymer | molar ratio of units | molecular weight |
|---|---|---|---|
| (g) | ![structure with p-tolyl-CONHSO$_2$, CH$_3$/CO(CH$_2$CH$_2$O)$_4$CH$_3$, CN, COOCH$_2$-phenyl units] | 35:10:50:5 | 55000 |
| (h) | ![structure with 2,6-dimethylphenyl-CONHSO$_2$, CH$_3$/CO(CH$_2$CH$_2$O)$_9$CH$_3$, CN, COOCH$_3$ units] | 20:5:60:15 | 46000 |
| (i) | ![structure with phenyl-CONHCO, CO$_2$(C$_2$H$_4$O)$_{11}$(C$_3$H$_6$O)$_{22}$(C$_2$H$_4$O)$_{11}$H, CH$_3$/COOCH$_2$-phenyl units] | 30:30:40 | 52000 |
| (j) | ![structure with 4-(SO$_2$NHCO-phenyl)-phenyl, CH$_3$/CO(CH$_2$CH$_2$O)$_9$H, CN units] | 20:20:60 | 48000 |

TABLE 1-continued

| vinyl polymer compound | structure units of polymer | molar ratio of units | molecular weight |
|---|---|---|---|
| (k) | —(CH$_2$—CH)—C$_6$H$_4$—SO$_2$NHSO$_2$—C$_6$H$_5$ / —(CH$_2$—C(CH$_3$))—CO(CH$_2$CH$_2$O)$_2$CH$_3$ / —(CH$_2$—CH)—COOCH$_3$ | 30:20:50 | 38000 |
| (l) | —(CH$_2$—C(CH$_3$))—CO(CH$_2$CH$_2$O)$_4$CH$_3$ / maleimide unit / —(CH$_2$—CH)—CN / —(CH$_2$—CH)—COOCH$_2$C$_6$H$_5$ | 25:10:50:15 | 55000 |
| (m) (Comp.*) | —(CH$_2$—C(CH$_3$))—CONH—C$_6$H$_4$—SO$_2$NH$_2$ / —(CH$_2$—CH)—CN / —(CH$_2$—C(CH$_3$))—COOCH$_3$ | 20:50:30 | 34000 |
| (n) (Comp.*) | —(CH$_2$—C(CH$_3$))—CONH—C$_6$H$_4$—SO$_2$NH$_2$ / —(CH$_2$—C(CH$_3$))—COOCH$_3$ | 40:60 | 43000 |

TABLE 1-continued

| vinyl polymer compound | structure units of polymer | molar ratio of units | molecular weight |
|---|---|---|---|
| (o) (Comp.*) | —(CH₂—C(CH₃))—(CH₂—CH(C₆H₄-CH₃)CONHSO₂)—(CH₂—CH(CN))—(CH₂—CH(COOCH₂C₆H₅))— with COOCH₃ group | 30:20:40:10 | 46000 |
| (p) (Comp.*) | —(CH₂—CH(C₆H₄-SO₂NHSO₂-C₆H₅))—(CH₂—CH(COOCH₃))— | 40:60 | 56000 |
| (q) (Comp.*) | cresol-formaldehyde novolak resin (meta/para ratio; 6/4, weight-average molecular weight 8,000) | | |

*Comparative compound

Examples 1 to 13 and Comparative Examples 1 to 3

Surface of an aluminum plate having thickness of 0.30 mm was grained with nylon brush with a suspension of 400 mesh pumice stone in water and then fully washed with water. The plate was immersed in an aqueous solution of a 10% sodium hydroxide at 70° C. for 60 seconds to etch the plate and was washed with water. Then the plate was washed with 20% $HNO_3$ to neutralize and was again washed with water. Next, electrolytic graining of the plate was conducted in a 1% aqueous solution of nitric acid using an alternating continuous sine wave having a voltage of $V_A=12.7$ volts and in a quantity of electricity at the anode of 160 coulomb/$dm^2$. Roughness of the surface (Ra) of thus obtained plate was 0.6 μm. The plate was then immersed in a 30% aqueous $H_2SO_4$ solution at 55° C. for 2 minutes to conduct desmutting treatment. Further, the plate was anodized in a 20% aqueous $H_2SO_4$ solution using current density of 2A/$dm^2$ to obtain a substrate having 2.7g/$m^2$ of anodized layer.

The surface of thus obtained plate was then coated with Coating solution (A) for underlying layer and dried for 30 seconds at 80° C. The amount of the layer after dried was 30 mg/$m^2$.

| Coating solution (A) for underlying layer | |
|---|---|
| Aminoethylphosphonic acid | 0.01 g |
| Phenylphosphonic acid | 0.15 g |
| Triethanolamine | 0.05 g |
| β-Alanine | 0.10 g |
| Methanol | 40 g |
| Pure water | 60 g |

Thus, substrate (I) was prepared.

Then, Coating solution (B) or (C) for photosensitive layer was applied on substrate (I) by rod coating in an amount of 25 ml/$m^2$, and then, thus obtained coating was dried at 100° C. for 1 minute to obtain positive-working presensitized plates [B]-1 to [B]-10, and [C]-1 to [C]-6 (Table 2). The amount of each coating on the substrate after dried was about 1.3g/$m^2$.

| [Coating solution (B) for photosensitive layer] | |
|---|---|
| Ester compound of 2,3,4-trihydroxybenzophenone and naphthoquinone-1,2-diazide-5-sulfonyl chloride (esterified ratio; 90 mol %) | 0.45 g |
| Cresol-formaldehyde novolak resin (meta/para ratio = 6/4, weight-average molecular weight: 3,000, number-average molecular weight: 1,100, containing 0.7% unreacted cresol) | 0.2 g |
| m-Cresol-formaldehyde novolak resin (weight-average molecular weight: 1,700, number-average molecular weight: 600, containing 1% unreacted cresol) | 0.3 g |
| Condensate of pyrogallol and acetone (weight-average molecular weight: 2,200, number-average molecular weight: 700) | 0.1 g |
| Vinyl polymer compound of the present invention (or comparative polymer) | 1.1 g |
| p-Normaloctylphenol-formaldehyde resin (as described in U.S. Pat. No. 4,123,279) | 0.02 g |
| Naphthoquinonediazide-1,2-diazide-4-sulfonyl chloride | 0.01 g |
| Tetrahydrophthalic anhydride | 0.02 g |
| Benzoic acid | 0.02 g |
| 4-[p-N-(p-hydroxybenzoyl)aminophenyl]-2,6-bis(trichloromethyl)-s-triazine | 0.02 g |
| N-(1,2-Naphthoquinone-2-diazide-4-sulfonyloxy)-cyclohexane-1,2-dicarboximide | 0.01 g |
| Dye derived from Victoria Pure Blue BOH [Hodogaya Chemical Co., Ltd.] by changing counter anion thereof to 1-naphthalene sulfonic acid | 0.05 g |
| 1-[α-Methyl-α-(4-hydroxy3,5-dihydroxymethylphenyl)ethyl]-4-[α,α-bis(4-hydroxy3,5-dihydroxymethylphenyl)ethyl]benzene (Compound (X) described in J.P. KOKAI No. Hei 6-282067) | 0.04 g |
| Megafac F-176 (Dainippon Ink and Chemicals, Inc., fluorine atom-containing surfactant) | 0.01 g |
| Methyl ethyl ketone | 10 g |
| γ-Butyrolactone | 5 g |
| 1-Methoxy-2-propanol | 5 g |

| [Coating solution (C) for photosensitive layer] | |
|---|---|
| Ester compound of 2,3,4-trihydroxybenzophenone and naphthoquinone-1,2-diazide-5-sulfonyl chloride (esterified ratio; 90 mol %) | 0.45 g |
| Vinyl polymer compound of the present invention (or Comparative polymer) | 1.7 g |
| Naphthoquinonediazide-1,2-diazide-4-sulfonyl chloride | 0.01 g |
| Tetrahydrophthalic anhydride | 0.02 g |
| Benzoic acid | 0.02 g |
| 4-[p-N-(p-Hydroxybenzoyl)aminophenyl]-2,6-bis(trichloromethyl)-s-triazine | 0.02 g |
| N-(1,2-Naphthoquinone-2-diazide-4-sulfonyloxy)cyclohexanone-1,2-dicarobximide | 0.01 g |
| Dye derived from Victoria Pure Blue BOH [Hodogaya Chemical Co., Ltd.] by changing counter anion thereof to 1-naphthalene sulfonic acid | 0.05 g |
| 1-[α-Methyl-α-(4-hydroxy3,5-dihydroxymethylphenyl)ethyl]-4-[α,α-bis(4-hydroxy3,5-dihydroxymethylphenyl)ethyl]benzene (Compound (X) described in J.P. KOKAI No. Hei 6-282067) | 0.04 g |
| Megafac F-176 (Dainippon Ink and Chemicals, Inc., fluorine atom-containing surfactant) | 0.01 g |
| Methyl ethyl ketone | 10 g |
| γ-Butyrolactone | 5 g |
| 1-Methoxy-2-propanol | 5 g |

[Coating Solution (C) for Photosensitive Layer]

The presensitized plates [B]-1 to -10 and [C]-1 to -6 were irradiated with carbon arc lamp (30 amp.) at the distance of 70 cm with a positive clear original image (line and mesh image) that was adhered on the photosensitive layer of the plates before irradiation.

Thus irradiated plates [B]-1 to -10 and [C]-1 to -6 were automatically developed using automatic developing machine 800U (Fuji Photo Film Co., Ltd.) with DP-4 (trade name: Fuji Photo Film Co., LTD), which was diluted 8 times with water prior to use, at 25° C. for 40 seconds.

Then the number of printed copies obtained from plates [B]-1 to -10 and [C]-1 to -6 and contamination thereon were determined using printer KOR (Heidelberg) with a commercially available normal ink, a UV ink and quality papers. The results are shown on Table 2. "Contamination" was determined by direct observation and evaluated as "○" for almost no contamination and "x" for distinct contamination.

As seen from Table 2, the presensitized plates [B]-1 to -8 and [C]-1 to -5 prepared from the vinyl polymer compounds of the present invention (Examples 1 to 13) show higher durability to both the normal and UV ink and better contamination property, than the plates [B]-9,10, and [C]-6 (Comparative examples 1 to 3).

TABLE 2

| Plate and Example Nos. | Vinyl polymer compound | Number of copies printed with a normal ink | Number of copies printed with a UV ink | Contamination |
|---|---|---|---|---|
| [B]-1 Example 1 | (a) | 65,000 | 40,000 | ○ |
| [B]-2 Example 2 | (b) | 65,000 | 40,000 | ○ |
| [B]-3 Example 3 | (c) | 60,000 | 35,000 | ○ |
| [B]-4 Example 4 | (d) | 65,000 | 40,000 | ○ |
| [B]-5 Example 5 | (e) | 60,000 | 30,000 | ○ |
| [B]-6 Example 6 | (f) | 60,000 | 30,000 | ○ |
| [B]-7 Example 7 | (g) | 55,000 | 25,000 | ○ |
| [B]-8 Example 8 | (l) | 60,000 | 30,000 | ○ |
| [B]-9 Comp. ex. 1 | (g) | 35,000 | 16,000 | x |
| [B]-10 Comp. ex. 2 | (h) | 30,000 | 8,000 | ○ |
| [C]-1 Example 9 | (a) | 85,000 | 60,000 | ○ |
| [C]-2 Example 10 | (b) | 80,000 | 55,000 | ○ |
| [C]-3 Example 11 | (d) | 80,000 | 60,000 | ○ |
| [C]-4 Example 12 | (d) | 80,000 | 55,000 | ○ |
| [C]-5 Example 13 | (i) | 75,000 | 50,000 | ○ |
| [C]-6 Comp. ex. 3 | (h) | 40,000 | 15,000 | x |

Examples 14 to 20 and Comparative Examples 4 to 61

An aluminum plate (JIS A 1050) having a thickness of 0.24 mm was subjected to brush-graining with rotary nylon brushes described below and an aqueous suspension of about 21 $\mu$ (average particle size) pumice stone. The first brush had hairs with a length of 100 mm, a diameter of 0.95 mm and a density of 70/cm$^2$. The second brush had hairs with a length of 80 mm, a diameter of 0.295 mm and a density of 670/cm$^2$. Rotation speed of both the brush rolls was 250 rpm. Then the plate was sufficiently washed with water. After etching the plate by immersing in a 10% sodium hydroxide solution at 60° C. for 25 seconds and washing with running water, the plate was washed to neutralize with a 20% HNO$_3$ solution and then washed with water. The plate was then electrolytically surface-roughened in a 1% aqueous solution of nitric acid under the condition; using an alternating sine wave with VA 12.7 V and anodization electricity of 160 coulomb/dm$^2$. The roughness of thus treated surface was 0.79 $\mu$ (Ra). Then the plate was treated in a 1% aqueous solution of sodium hydroxide for 40° C. for 30 minutes. Then the plate was immersed in a 30% aqueous solution of sulfuric acid for 60° C. for 40 seconds to desmut the plate. The plate was then anodized in a 20% aqueous solution of sulfuric acid with direct current having density of 2 A/dm$^2$ so that the thickness of the resulting anodized layer became 1.6 g/m$^2$ to thus prepare a substrate. The surface of thus obtained plate was then coated with Coating solution (D) for underlying layer and dried for 30 seconds at 80° C. The amount of the layer after dried was 10 mg/m$^2$.

Coating Solution (D) for Underlying Layer

| Aminoethylphosphonic acid | 0.10 g |
| Phenylphosphonic acid | 0.15 g |
| Triethanolamine | 0.05 g |
| β-Alanine | 0.10 g |
| Methanol | 40 g |
| Pure water | 60 g |

Thus, substrate (II) was prepared. Then, the following Coating solution (E) for photosensitive layer was applied on substrate (II) by rod coating in an amount of 12 ml/m$^2$, and then, thus obtained coating was dried at 100° C. for 1 minute to obtain positive-working presensitized plates of Examples 14 to 20 and Comparative examples 4 to 6. The amount of each coating on the substrate after dried was about 1.15 g/m$^2$. Further, in order to cut the time to vacuum adhesion, a mat layer was formed on the photosensitive layer as described in J. P. KOKOKU No. Sho 61-28986.

| [Coating solution (E) for photosensitive layer] | |
|---|---|
| Ester of pyrogallol-acetone resin and 1,2-diazonaphthoquinone-5-sulfonyl chloride (described in Example 1 of U.S. Pat. No. 3,635,709) | 0.8 g |
| Vinyl polymer compound of the present invention (or comparative polymer) | 0.4 g |
| Cresol-formaldehyde novolak resin (meta/para ratio = 6/4, weight-average molecular weight: 8,000) | 1.5 g |
| Phenol-formaldehyde novolak resin (weight-average molecular weight: 15,000) | 0.2 g |
| p-Normaloctylphenol-formaldehyde resin (as described in U.S. Pat. No. 4,123,279) | 0.02 g |
| Naphthoquinonediazide-1,2-diazide-4-sulfonyl chloride | 0.01 g |
| Tetrahydrophthalic anhydride | 0.02 g |
| Benzoic acid | 0.02 g |
| Pyrogallol | 0.05 g |
| 4-[p-N-(p-hydroxybenzoyl) aminophenyl]-2,6-bis (trichloromethyl)-s-triazine (hereinafter abbreviated as "triazine A") | 0.07 g |
| Dye derived from Victoria Pure Blue BOH [Hodogaya Chemical Co., Ltd.] by changing counter anion thereof to 1-naphthalene sulfonic acid | 0.045 g |
| Megafac F-176PF (Dainippon Ink and Chemicals, Inc., fluorine atom containing surfactant) | 0.01 g |
| MEK/(1-methoxy-2-propanol) | 15g/10g |

Each plate was irradiated by metal halide lamp (3 kW) at a distance of 1 m for 1 minute through Step Tablet (comprising 15 steps and having a optical density difference of 0.15, Fuji Photo Film Co. Ltd.), and then developed at 30° C. for 12 seconds using automatic developing machine PS-900 U (available from Fuji Photo Film Co., Ltd.) with a developer comprising a potassium silicate of which molar ratio [SiO$_2$]/[K$_2$O] was 1.16 and SiO$_2$ content was 1.4% by weight.

Development latitude was evaluated using a developer which was prepared from the above developer and had pH that was adjusted to 0.2 higher or lower than the pH of the above developer. The change of the steps of the Step Tablet when the same plate was developed with the developers having different pH was determined. Smaller change of steps shows better development latitude of the plate.

Printing durability was evaluated as follows. After each plate was irradiated and developed with a developer, the number of normally printed copies from each plate was determined using a printer (Sprint, Komori Printer Co. Ltd.). The higher number of normally printed copies indicates better printing durability.

Developability with a used developer was determined as follows. A used developer was prepared by developing repeatedly a positive-working presensitized plate for lithographic printing plate (VS, Fuji Photo Film Co. Ltd.) with the above-described developer (4.0 m² of plate was treated per 1 litter of developer). Then each plate prepared above was developed with a fresh developer and a used developer at 25° C. The difference between the time to develop with each developer was determined. The different time (second) thus obtained was defined as the developability with a used developer of each plate. Shorter time indicates better developability with a used developer. The results are shown in Table 3.

TABLE 3

| Example | Vinyl polymer compound | Printing durability | Developability with a used developer (seconds) | Developing latitude |
| --- | --- | --- | --- | --- |
| 14 | (a) | 100,000 | 0 | 5.0 |
| 15 | (g) | 100,000 | 0 | 5.0 |
| 16 | (h) | 100,000 | 0 | 5.0 |
| 17 | (i) | 95,000 | 5 | 5.0 |
| 18 | (j) | 100,000 | 0 | 5.0 |
| 19 | (k) | 95,000 | 5 | 5.0 |
| 20 | (l) | 100,000 | 5 | 5.0 |
| Comp. ex. 4 | (o) | 95,000 | 15 | 6.0 |
| Comp. ex. 5 | (p) | 95,000 | 10 | 6.5 |
| Comp. ex. 6 | (q) | 70,000 | 5 | 5.0 |

Table 3 shows that the lithographic printing plates using the vinyl polymer compound of the present invention (Examples 14 to 20) had excellent properties such as development latitude, developability with a used developer and printing durability. In contrast, the lithographic printing plates without the vinyl polymer compound of the present invention (Comparative examples 4 to 6) shows poor development latitude, developability with a used developer and printing durability.

What is claimed is:

1. A photosensitive composition comprising a vinyl polymer compound which is insoluble in water and soluble in an aqueous alkaline solution and o-naphthoquinonediazide compound, wherein said vinyl polymer compound is a copolymer comprising at least one monomer unit derived from monomer compound (A) and at least one monomer unit derived from monomer compound (B) described below and the content of monomer unit derived from (A) ranges from 10 to 35% by mole:

(A) a compound having an alkaline-soluble group represented by the following general formula (I), (II) or (III),

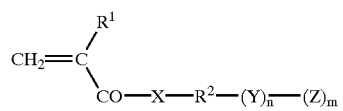
(I)

(wherein, X represents —O— or —NR³—; R¹ represents —H or —CH₃; R² represents single bond or bivalent organic group; Y represents arylene group; Z represents —OH, —COOH, —SO₂NHR⁴, —NHSO₂R⁵, —CONHSO₂R⁶, —SO₂NHCOR⁷, —NHCON HSO₂R⁸, —SO₂NHCONHR⁹, —CONHSO₂NHR¹⁰, —NHSO₂NHCOR¹¹, —SO₂NHSO₂R¹², —COCH₂COR¹³, —OCONHSO₂R¹⁴, or SO₂NHCOOR¹⁵; n is 0 or 1, but when R² is single bond and Z is —OH, n is 1; m is an integer of 1 or higher; R³ is hydrogen atom or optionally substituted C1–12 alkyl group, C1–12 cycloalkyl group, C1–12 aryl group or C1–12 aralkyl group; R⁴, R⁹, and R¹⁰ each represents hydrogen atom or optionally substituted C1–12 alkyl group, C1–12 cycloalkyl group, C1–12 aryl group or C1–12 aralkyl group: R⁵, R⁶, R⁷, R⁸, R¹¹, R¹², R¹³, R¹⁴, and R¹⁵ each represents optionally substituted C1–12 alkyl group, C1–12 cycloalkyl group, C1–12 aryl group or C1–12 aralkyl group),

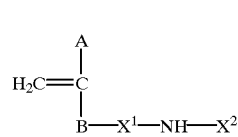
(II)

[wherein, A represents hydrogen atom, halogen atom or alkyl group; B represents single bond, alkylene group, phenylene group, substituted alkylene group or substituted phenylene group;

X¹ represents

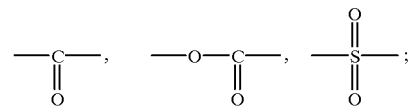

X² represents

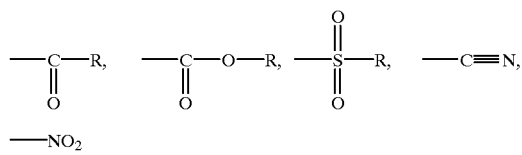

—NO₂

(wherein, R represents optionally substituted alkyl group, cycloalkyl group, phenyl group, or naphthyl group)],

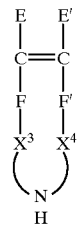
(III)

(wherein, E and E' each represents hydrogen atom, halogen atom, alkyl group or phenyl group; F and F' each separately represents single bond, alkylene group or substituted alkylene group;

$X^3$ and $X^4$ each represents

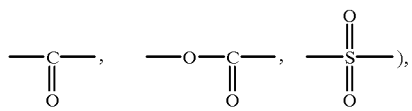

(B) (meth)acrylate having poly(oxyalkylene) chain.

2. The photosensitive composition of claim 1, wherein, in formula (I), Y is phenylene group or naphthylene group, Z is —OH, —COOH, —$SO_2NHR^4$, or —$NH_2SO_2R^5$, n is 1, m is 1 or 2, X is —O— or —$NR^3$— ($R^3$ is hydrogen atom), $R^4$ is hydrogen atom, C1–3 alkyl group or optionally substituted phenylene group, $R^5$ is, C1–3 alkyl group or optionally substituted phenylene group, $R^2$ is a single bond or optionally substituted C1–12 alkylene group, C1–12 cycloalkylene group, C1–12 arylene group, ester linking group, amide linking group, imide linking group, ether linking group, urethane linking group and/or urea linking group, in general formula (II), A represents hydrogen atom or C1–4 alkyl group, B represents single bond or phenylene group, $X^1$ represents

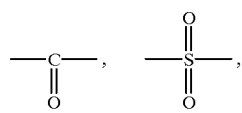

$X^2$ represents

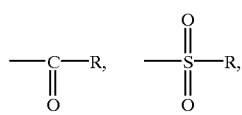

wherein, R represents optionally substituted phenyl group, naphthyl group, cyclohexyl group or C1–4 alkyl group, which may have halogen atom, C1–4 alkyl group or alkoxy group as a substituent, and in general formula (III), E and E' each represents hydrogen atom or C1–4 alkyl group, F and F' each separately represents single bond, or C1–4 alkylene group, $X^3$ and $X^4$ represent

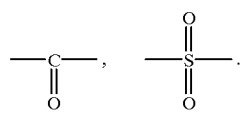

3. The photosensitive composition of claim 1, wherein said vinyl polymer compound is a copolymer further comprising a monomer unit derived from (C) a monomer compound having at least one polymerizable unsaturated bond and no alkaline soluble group represented by general formula (I), (II) or (III) and no poly(oxyalkylene) chain.

4. A photosensitive composition comprising a vinyl polymer compound which is insoluble in water and soluble in an aqueous alkaline solution and o-naphthoquinonediazide compound, wherein said vinyl polymer compound is a copolymer comprising at least one monomer unit derived from monomer compound (A) and at least one monomer unit derived from monomer compound (B) described below, and an acrylonitrile or methacrylonitrile;

(A) a compound having an alkaline-soluble group represented by the following general formula (I), (II) or (III),

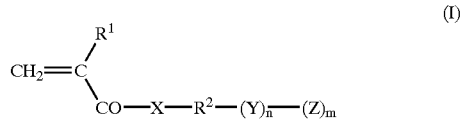

(wherein, X represents —O— or —$NR^3$—; $R^1$ represents —H or —$CH_3$; R represents single bond or bivalent organic group; Y represents arylene group; Z represents —OH, —COOH, —$SO_2NHR^4$, —$NHSO_2R^5$, —$CONHSO_2R^6$, —$SO_2NHCOR^7$, —$NHCONHSO_2R^8$, —$SO_2NHCONHR^9$, —$CONHSO_2NHR^{10}$, —$NHSO_2NHCOR^{11}$, —$SO_2NHSO_2R^{12}$, —$COCH_2COR^{13}$, —$OCONHSO_2R^{14}$, or $SO_2NHCOOR^{15}$; n is 0 or 1, but when $R^2$ is single bond and Z is —OH, n is 1; m is an integer of 1 or higher; $R^3$ is hydrogen atom or optionally substituted C1–12 alkyl group, C1–12 cycloalkyl group, C1–12 aryl group or C1–12 aralkyl group; $R^4$, $R^9$, and $R^{10}$ each represents hydrogen atom or optionally substituted C1–12 alkyl group, C1–12 cycloalkyl group, C1–12 aryl group or C1–12 aralkyl group: $R^5$, $R^6$, $R^7$, $R^8$, $R^{11}$, $R^{12}$, $R^{13}$, $R^{14}$, and $R^{15}$ each represents optionally substituted C1–12 alkyl group, C1–12 cycloalkyl group, C1–12 aryl group or C1–12 aralkyl group),

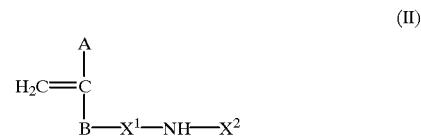

[wherein, A represents hydrogen atom, halogen atom or alkyl group; B represents single bond, alkylene group, phenylene group, substituted alkylene group or substituted phenylene group;

$X^1$ represents

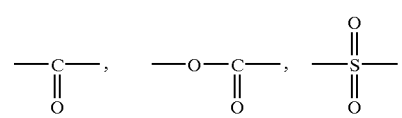

$X^2$ represents

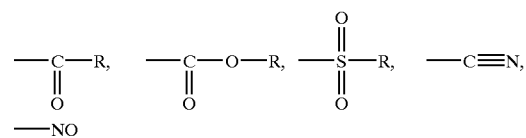

—NO (wherein, R represents optionally substituted alkyl group, cycloalkyl group, phenyl group, or naphthyl group)], (III)

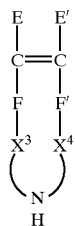

(wherein, E and E' each represents hydrogen atom, halogen atom, alkyl group or phenyl group; F and F' each separately represents single bond, alkylene group or substituted alkylene group;

$X^3$ and $X^4$ each represents

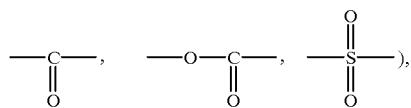

(B) (meth)acrylate having poly(oxyalkylene) chain.

5. The photosensitive composition of claim 4, wherein, in formula (I), Y is phenylene group or naphthylene group, Z is —OH, —COOH, —SO$_2$NHR$^4$, or —NH$_2$SO$_2$R$^5$, n is 1, m is 1 or 2, X is —O— or —NR$^3$— (R3 is hydrogen atom), R$^4$ is hydrogen atom, C1–3 alkyl group or optionally substituted phenylene group, R$^5$, is C1–3 alkyl group or optionally substituted phenylene group, R$^2$is a single bond or optionally substituted C1–12 alkylene group, C1–12 cycloalkylene group, C1–12 arylene group, ester linking group, amide linking group, imide linking group, ether linking group, urethane linking group and/or urea linking group, in general formula (II), A represents hydrogen atom or C1–4 alkyl group, B represents single bond or phenylene group, $X^1$ represents

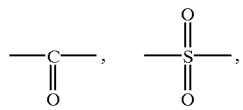

$X^2$ represents

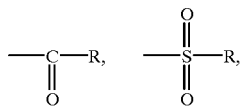

wherein, R represents optionally substituted phenyl group, naphthyl group, cyclohexyl group or C1–4 alkyl group, which may have halogen atom, C1–4 alkyl group or alkoxy group as a substituent, and in general formula (III), E and each represents hydrogen atom or C1–4 alkyl group, F and F' each separately represents single bond, or C1–4 alkylene group, $X^3$ and $X^4$ represent

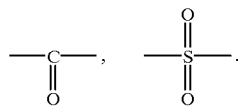

* * * * *